United States Patent
Koul et al.

(10) Patent No.: US 11,606,152 B2
(45) Date of Patent: Mar. 14, 2023

(54) CHANNEL PREDICTIVE BEHAVIOR AND FAULT ANALYSIS

(71) Applicant: Cisco Technology, Inc., San Jose, CA (US)

(72) Inventors: Amendra Koul, San Francisco, CA (US); David Nozadze, San Jose, CA (US); Mike Sapozhnikov, San Jose, CA (US); Joel Goergen, Soulsbyville, CA (US); Arnav Shailesh Shah, Sunnyvale, CA (US)

(73) Assignee: Cisco Technology, Inc., San Jose, CA (US)

( * ) Notice: Subject to any disclaimer, the term of this patent is extended or adjusted under 35 U.S.C. 154(b) by 14 days.

(21) Appl. No.: 17/342,316

(22) Filed: Jun. 8, 2021

(65) Prior Publication Data
US 2022/0393776 A1 Dec. 8, 2022

(51) Int. Cl.
*H04B 17/15* (2015.01)
*H04B 17/24* (2015.01)
*H04B 10/071* (2013.01)

(52) U.S. Cl.
CPC ........... *H04B 17/15* (2015.01); *H04B 10/071* (2013.01); *H04B 17/24* (2015.01)

(58) Field of Classification Search
CPC ....... H04B 17/15; H04B 10/071; H04B 17/24
USPC .............................................. 375/224; 398/16
See application file for complete search history.

(56) References Cited

U.S. PATENT DOCUMENTS

| | | | |
|---|---|---|---|
| 6,046,797 A * | 4/2000 | Spencer | G01M 11/3127 356/73.1 |
| 2005/0057880 A1 | 3/2005 | Bailey et al. | |
| 2005/0152268 A1 | 7/2005 | Lasartre | |
| 2006/0184864 A1 | 8/2006 | Lasartre | |
| 2007/0152677 A1 * | 7/2007 | Barsumian | G01R 31/11 324/533 |

(Continued)

FOREIGN PATENT DOCUMENTS

| | | |
|---|---|---|
| CN | 109245950 A | 1/2019 |
| WO | 2004070398 A2 | 8/2004 |
| WO | 2020084408 A1 | 4/2020 |

OTHER PUBLICATIONS

Devarajulu, Hemachandar Tanukonda et al. "Improving Terahertz Signal Travel Distance for Fault Isolation"; 2017 IEEE 67th Electronic Components and Technology Conference (ECTC), IEEE, May 30, 2017; pp. 1145-1152, XP033136180, DOI: 10.1108/ECTC.2017.225; [retrieved on Aug. 1, 2017].

(Continued)

*Primary Examiner* — Don N Vo
(74) *Attorney, Agent, or Firm* — Merchant & Gould P.C.

(57) ABSTRACT

Channel predictive behavior and fault analysis may be provided. A forward time value may be determined comprising a time a forward signal takes to travel from a transmitter over a channel to the receiver. Next, a reflected time value may be determined comprising a time a reflected signal takes to travel to the receiver. The reflected signal may be associated with the forward signal. A discontinuity may then be determined to exist on the channel based on the forward time value and the reflected time value. The reflected signal may be caused by the discontinuity and a high impedance or low impedance at the transmitter present after the forward signal is sent.

17 Claims, 3 Drawing Sheets

(56) References Cited

U.S. PATENT DOCUMENTS

| | | | | |
|---|---|---|---|---|
| 2010/0188095 A1* | 7/2010 | Maslen | ............... | G01R 31/11 |
| | | | | 324/533 |
| 2013/0106399 A1* | 5/2013 | Gohel | ............... | G01R 35/005 |
| | | | | 324/76.77 |
| 2014/0133488 A1 | 5/2014 | Patel et al. | | |
| 2017/0104522 A1* | 4/2017 | Zinevich | ............. | H04B 10/071 |
| 2020/0120519 A1 | 4/2020 | Horton et al. | | |
| 2021/0218125 A1* | 7/2021 | Ali | ..................... | H01Q 23/00 |

OTHER PUBLICATIONS

International Search Report and Written Opinion issued in International application PCT/US2022/032150, dated Oct. 4, 2022 (15 pages).

\* cited by examiner

CHANNEL PREDICTIVE BEHAVIOR AND FAULT ANALYSIS

TECHNICAL FIELD

The present disclosure relates generally to channel predictive behavior and fault analysis.

BACKGROUND

A Serializer/Deserializer (SerDes) is a pair of functional blocks used in high speed communications to compensate for limited Input/Output (I/O). These functional blocks convert data between serial data and parallel interfaces in each direction. The term "SerDes" generically refers to interfaces used in various technologies and applications. The primary use of a SerDes is to provide data transmission over a single line or a differential pair in order to minimize the number of I/O pins and interconnects.

The basic SerDes function is made up of two functional blocks: i) the Parallel In Serial Out (PISO) block (i.e., Parallel-to-Serial converter); and ii) the Serial In Parallel Out (SIPO) block (i.e., Serial-to-Parallel converter). There are 4 different SerDes architectures: i) Parallel clock SerDes; ii) Embedded clock SerDes; iii) 8b/10b SerDes; and iv) Bit interleaved SerDes.

The PISO block typically has a parallel clock input, a set of data input lines, and input data latches. It may use an internal or external Phase-Locked Loop (PLL) to multiply the incoming parallel clock up to the serial frequency. The simplest form of the PISO has a single shift register that receives the parallel data once per parallel clock, and shifts it out at the higher serial clock rate. Implementations may also make use of a double-buffered register to avoid metastability when transferring data between clock domains.

The SIPO block has a receive clock output, a set of data output lines and output data latches. The receive clock may have been recovered from the data by the serial clock recovery technique. However, SerDes that do not transmit a clock use a reference clock to lock the PLL to the correct Tx frequency, avoiding low harmonic frequencies present in the data stream. The SIPO block then divides the incoming clock down to the parallel rate. Implementations typically have two registers connected as a double buffer. One register is used to clock in the serial stream, and the other is used to hold the data for the slower, parallel side.

BRIEF DESCRIPTION OF THE FIGURES

The accompanying drawings, which are incorporated in and constitute a part of this disclosure, illustrate various embodiments of the present disclosure. In the drawings.

DETAILED DESCRIPTION

Overview

Figure 1:
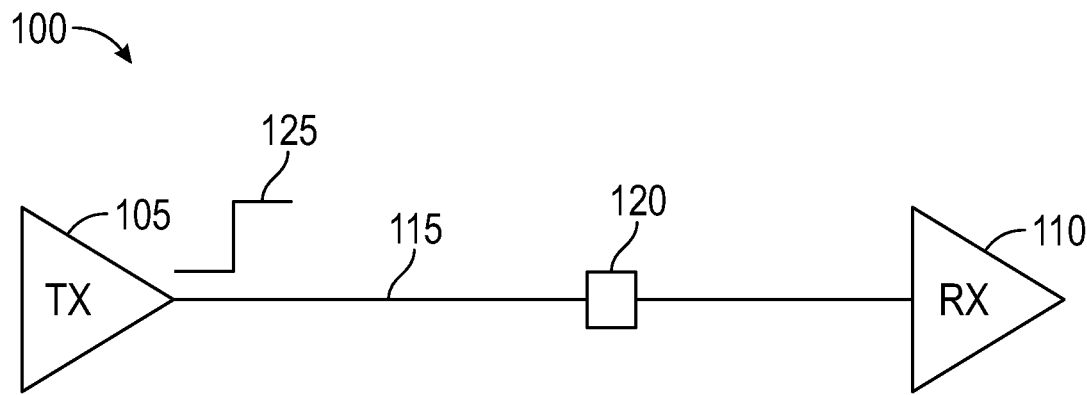
FIG. 1 is a block diagram of an operating environment for providing connectivity failure detection.

Channel predictive behavior and fault analysis may be provided. A forward time value may be determined comprising a time a forward signal takes to travel from a transmitter over a channel to the receiver. Next, a reflected time value may be determined comprising a time a reflected signal takes to travel to the receiver. The reflected signal may be associated with the forward signal. A discontinuity may then be determined to exist on the channel based on the forward time value and the reflected time value. The reflected signal may be caused by the discontinuity and a high impedance or low impedance at the transmitter present after the forward signal is sent.

Both the foregoing overview and the following example embodiments are examples and explanatory only and should not be considered to restrict the disclosure's scope, as described and claimed. Furthermore, features and/or variations may be provided in addition to those described. For example, embodiments of the disclosure may be directed to various feature combinations and sub-combinations described in the example embodiments.

Example Embodiments

The following detailed description refers to the accompanying drawings. Wherever possible, the same reference numbers are used in the drawings and the following description to refer to the same or similar elements. While embodiments of the disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the disclosure. Instead, the proper scope of the disclosure is defined by the appended claims.

Often Backplane/Printed Circuit Board (PCB) or cable connectors pins may not make good electrical connection (e.g., that may cause a discontinuity), which may cause signal reflections or partial signal loss. This may lead to SerDes link failure or Bit Error Ratio (BER) degradation. Consequently, there may be a need to detect where a physical connectivity failure is located so that a user may try to improve or replace the connection.

Conventional systems may detect connection failure using a Time Domain Reflectometer (TDR). This may be done using a driver that is able to both transmit and receive a signal. Some high-speed SerDes may work in a single direction. This may mean that a receiver may only receive a signal and not be able to transmit. Similarly, the transmitter may only transmit a signal and may not receive a signal. Accordingly, detecting channel connectivity failure using TDR in a SerDes receiver may not be possible.

Embodiments of the disclosure may provide a process to detect connectivity failure without the transmitter detecting a reflected signal. Unlike Optical TDR (OTDR) and Full duplex in which a driver may both transmit and receive, embodiments of the disclosure may use only a receiver to detect a signal and measure a location of a discontinuity based on a time difference between a direct signal arriving from the transmitter at the receiver and a reflected signal arriving at the receiver.

With a large number of links on an electronic device, channel predictive behavior and fault analysis may be challenging. Embodiments of the disclosure may provide link analysis using metrics obtained from data collection and applied Machine Learning (ML). Link analysis may be used to predict link performance on other systems also using similar metrics. Metrics used in this link analysis may comprise metrics obtained from the aforementioned connectivity failure detection.

Furthermore, SerDes power may be a significant portion (e.g., 20%) of the total power of a chip. With a large number of chips (e.g., 30) used per modular/back plane systems, energy consumption may be significant. Embodiments of the disclosure may provide a "green" mode optimization process to minimize energy cost by a metric based power versus performance tradeoff on a system. Metrics used in this optimization may comprise metrics obtained from the aforementioned connectivity failure detection.

Connectivity Failure Detection

FIG. 1 shows an operating environment 100 for providing connectivity failure detection. As shown in FIG. 1, operating environment 100 may comprise a transmitter 105, a receiver 110, and a channel 115 linking transmitter 105 and receiver 110. Consistent with embodiments of the disclosure, transmitter 105 may comprise a SerDes transmitter and receiver 110 may comprise a SerDes receiver. Transmitter 105 and receiver 110 may be included in a SerDes link. As shown in FIG. 1, channel 115 may comprise a discontinuity 120 (e.g., an imperfection or poor electrical connection). A forward signal 125 may be transmitted from transmitter 105, through discontinuity 120, and may be received by receiver 110 as described in greater detail below. Forward signal 125 may comprise, but is not limited to, a step or pulse signal.

The elements described above of operating environment 100 (e.g., transmitter 105 may and receiver 110) may be practiced in hardware and/or in software (including firmware, resident software, micro-code, etc.) or in any other circuits or systems. The elements of operating environment 100 may be practiced in electrical circuits comprising discrete electronic elements, packaged or integrated electronic chips containing logic gates, a circuit utilizing a microprocessor, or on a single chip containing electronic elements or microprocessors. Furthermore, the elements of operating environment 100 may also be practiced using other technologies capable of performing logical operations such as, for example, AND, OR, and NOT, including but not limited to, mechanical, optical, fluidic, and quantum technologies. As described in greater detail below with respect to FIG. 4, the elements of operating environment 100 may be practiced in a computing device 400.

Figure 2:
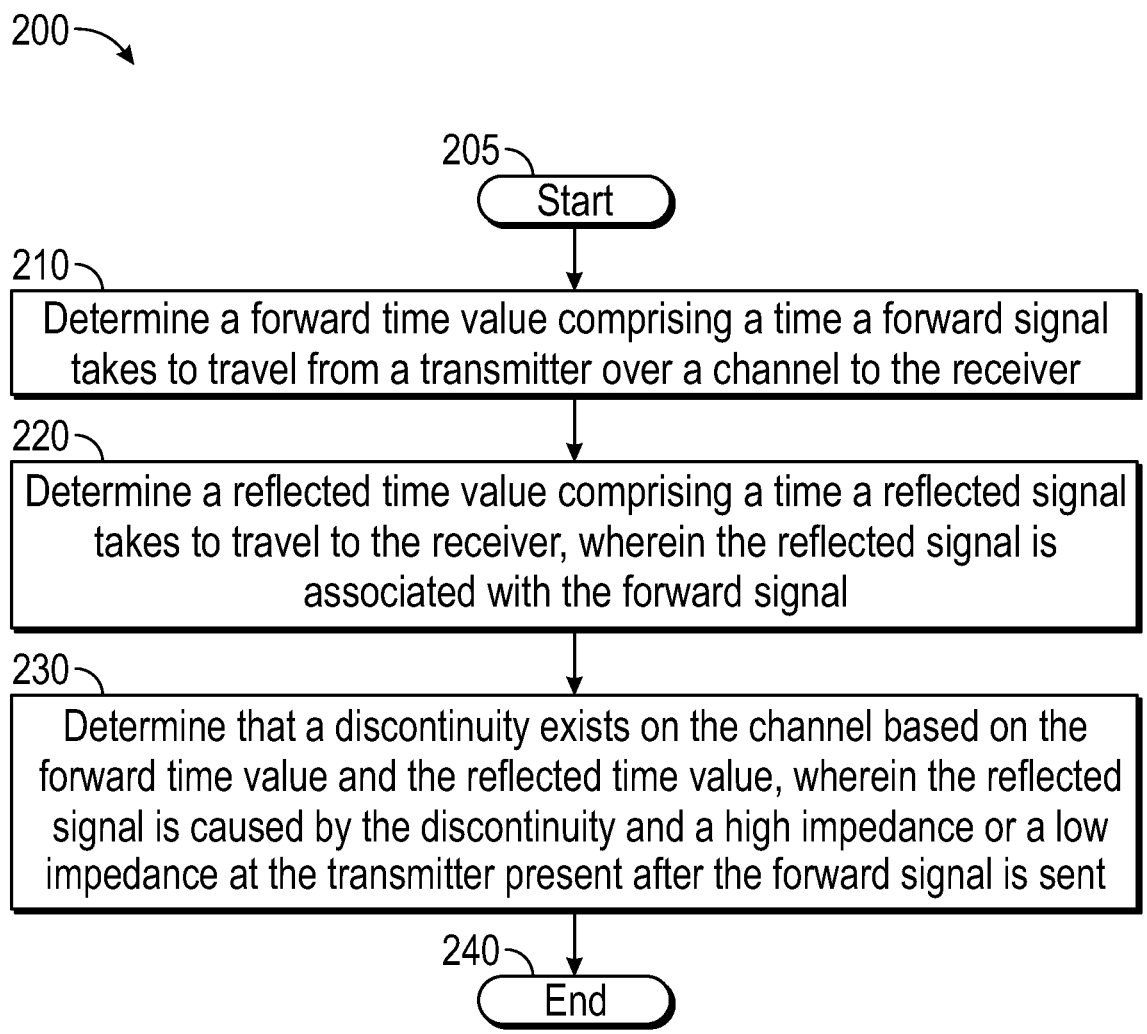
FIG. 2 is a flow chart of a method for providing connectivity failure detection.

FIG. 2 is a flow chart setting forth the general stages involved in a method 200 consistent with embodiments of the disclosure for providing connectivity failure detection. Method 200 may be implemented using receiver 110 as described in more detail above with respect to FIG. 1. For example, in some embodiments of the disclosure, method 200 may be implemented at the firmware level of a SerDes comprising transmitter 105 and receiver 110. Ways to implement the stages of method 200 will be described in greater detail below.

Figure 3A:
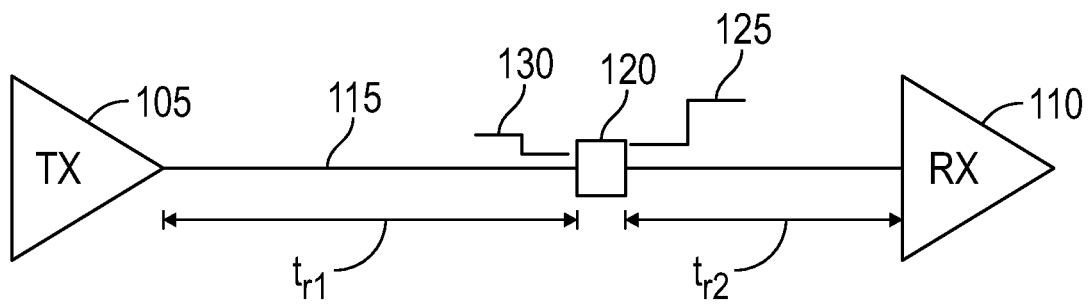
FIGS. 3A, 3B, and 3C illustrate connectivity failure detection.
Figure 3B:
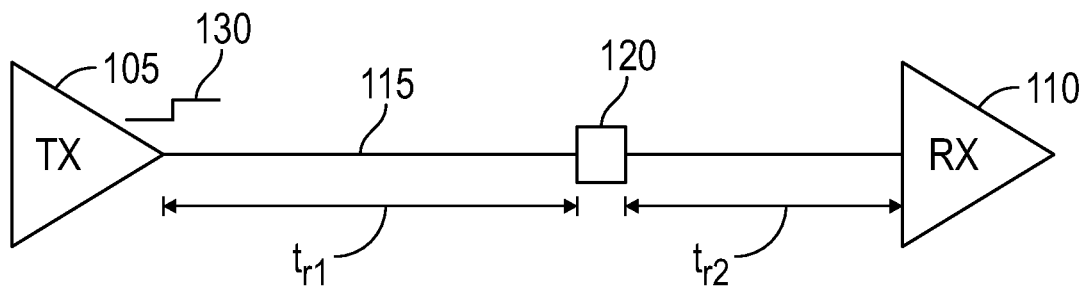
Figure 3C:
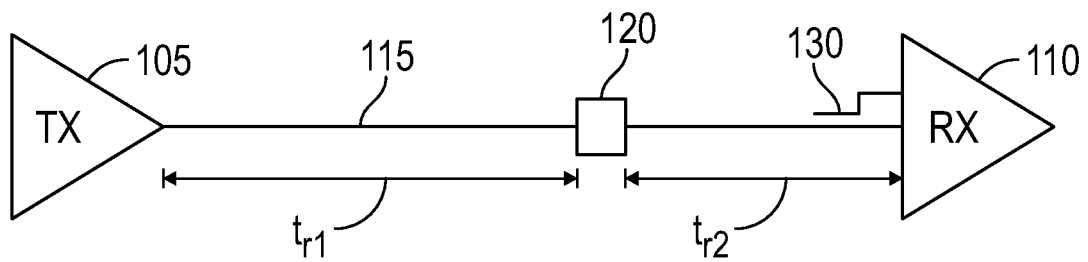

Method 200 may begin at starting block 205 and proceed to stage 210 where receiver 110 may determine a forward time value comprising a time that forward signal 125 takes to travel from transmitter 105 over channel 115 to receiver 110. For example, the forward time value may comprise $t_d$ where $t_d$ may comprise the sum of $t_{r1}$ and $t_{r2}$ (i.e., $t_d = t_{r1} + t_{r2}$). As illustrated by FIGS. 3A, 3B, and 3C, $t_{r1}$ may comprise the time it takes forward signal 125 to travel from transmitter 105 to discontinuity 120. After forward signal 125 reaches discontinuity 120, $t_{r2}$ may comprise the time it takes forward signal 125 to travel from discontinuity 120 to receiver 110.

From stage 210, where receiver 110 determines the forward time value comprising the time that forward signal 125 takes to travel from transmitter 105 over channel 115 to receiver 110, method 200 may advance to stage 220 where receiver 110 may determine a reflected time value comprising a time that a reflected signal 130 takes to travel to receiver 110. Reflected signal 130 may be associated with forward signal 125. For example, the reflected time value may comprise $t_r$, where $t_r$ may comprise the sum of three times $t_{r1}$ and $t_{r2}$ (i.e., $t_r = 3t_{r1} + t_{r2}$).

As illustrated by FIGS. 3A, 3B, and 3C, to may comprise the time it takes forward signal 125 to travel from transmitter 105 to discontinuity 120. After forward signal 125 reaches discontinuity 120 in time tri, tri may also comprise the time it takes reflected signal 130 (i.e., a reflected version of forward signal 125 as shown in FIG. 3A) to reflect off of discontinuity 120 and travel from discontinuity 120 back to transmitter 105 (e.g., as shown in FIG. 3B). Because transmitter 105 may have been turned off after forward signal 125 was sent, when reflected signal 130 reaches transmitter 105, reflected signal 130 may reflect off of transmitter 105 and travel from transmitter 105 back to discontinuity 120 in time $t_{r1}$. Once reflected signal 130 reaches discontinuity 120, $t_{r2}$ may comprise the time it takes reflected signal 130 to travel from discontinuity 120 to receiver 110 as illustrated by FIG. 3C. Accordingly, reflected signal 130 may arrive at receiver 110 in time $t_r$ (e.g., $t_r = 3t_{r1} + t_{r2}$) from when forward signal 125 was initially sent from transmitter 105.

As stated above, as soon as forward signal 125 was initially sent from transmitter 105, transmitter 105 may be turned off thus forming a high impedance (e.g., an open point) or low impedance state to cause a reflection at transmitter 105. Transmitter 105 being turned off may create a condition for reflected signal 130 to be reflected from transmitter 105. Consistent with embodiments of the disclosure, a condition may be created at transmitter 105 to cause a signal reflection. This condition, for example, may comprise, but is not limited to, a created low impedance or a created high impedance.

Once receiver 110 determines the reflected time value comprising the time reflected signal 130 takes to travel to receiver 110 in stage 220, method 200 may continue to stage 230 where receiver 110 may determine that discontinuity 120 exists on channel 115 based on the forward time value and the reflected time value. The reflected signal may be caused by discontinuity 120 and the high impedance or low impedance at transmitter 105 present after forward signal 125 is sent. For example, if receiver 110 receives a reflected version of forward signal 125 (i.e., reflected signal 130) at a time subsequent to receiving forward signal 125 and if the reflected version of forward signal 125 (i.e., reflected signal 130) has a magnitude greater than a predetermined threshold, receiver 110 may determine that discontinuity 120 exists.

Furthermore, receiver 110 may determine a location of discontinuity 120 based on the forward time value and the reflected time value. Consistent with embodiments of the disclosure, in determining the location of discontinuity 120, receiver 110 may determine a distance in channel 115 from receiver 110 to discontinuity 120. For example, transmitter 105 and receiver 110 may be synchronized. Receiver 110 may know the time when forward signal 125 was sent from transmitter 105. For example, transmitter 105 may communicate the time when forward signal 125 was sent from transmitter 105 via a time stamp in forward signal 125 or by other means. Receiver 110 may note the time when forward signal 125 was received at receiver 110. The difference between the time when forward signal 125 was sent from transmitter 105 and the time when forward signal 125 was received at receiver 110 may comprise the forward time value $t_d$ as described above. Similarly, receiver 110 may note the time when reflected signal 130 was received at receiver 110. The difference between the time when forward signal 125 was sent from transmitter 105 and the time when reflected signal 130 was received at receiver 110 may comprise the reflected time value $t_r$ as described above.

The aforementioned equations for $t_d$ and $t_r$ (i.e., $t_d=t_{r1}+t_{r2}$ and $t_r=3t_{r1}+t_{r2}$) may be solved for: $t_{r2}=0.5(3t_{td}-t_r)$. Accordingly, the distance in channel 115 from receiver 110 to discontinuity 120 may comprise $t_{r2}$ times c divided by the square root of $\varepsilon$ (i.e. $t_{r2}c/\sqrt{\varepsilon}$) where c is the speed of light in a vacuum and $\varepsilon$ is the dielectric constant of the transmission line dielectric medium (i.e., of channel 115). Similarly, the distance in channel 115 from transmitter 105 to discontinuity 120 may be determined using $t_{r1}$ in a similar manner. After receiver 110 determines that discontinuity 120 exists on channel 115 based on the forward time value and the reflected time value in stage 230, method 200 may then end at stage 240.

Link Analysis Using Metrics Obtained from Data Collection and Applied ML

With a large number of high-speed channel links on a hardware board, there may be a need to be able to track metrics relevant to the quality of each of these links over time, over various PCB's, and in various environment conditions. Consistent with embodiments of the disclosure, these metrics may comprise metrics associated with opens or shorts (e.g., discontinuities) in the links as described above with respect to FIG. 2 for example. Other examples may be associated with how to judge the quality of links. Accordingly, embodiments of the disclosure may comprise a process to debug, detect, analyze, and monitor links and collect data that over time via system logs or the cloud and utilize ML processes that may be used to predict link performance on other systems for similar metrics. This process may be performed by a computing device 400 as described in greater detail below.

In addition to the metrics comprising metrics associated with open or shorts in the links as described above with respect to FIG. 2, the metrics may also include: i) loss and pulse response; ii) Bit Error Ratio (BER)/Mean-Square Error (MSE)/Signal-to-Noise Ratio (SNR)/eye opening curves (horizontal and vertical)/bathtub curves (horizontal and vertical); iii) Pre-Forward Error Correction (FEC) BER data/Post-FEC BER data; iv) Analog-to-Digital Converter (ADC) saturation, Synthetic Aperture Radar (SAR) value; v) sum of gain stage equal to predict total equalization applied; vi) Continuous Time Linear Equalization (CTLE) values, Automatic Gain Control (AGC) values; and vii) time stamp metric data over time. The metrics and data, for example, may be extracted from the SerDes designs. In some cases (e.g., predicting loss), this can be calculated as a Fourier transform of the pulse response.

Embodiments of the disclosure may include a process for providing channel predictive behavior and fault analysis. This process may comprise measuring metrics (e.g., metrics associated with open or shorts in links as described above with respect to FIG. 2) on links in a number of high-speed channel links (e.g., SerDes links) on hardware boards in electronic devices. The measured metrics (tagged by type of link and timestamp) may be categorized in a plurality of buckets. The buckets may comprise, but are not limited to, a loss bucket, an equalization bucket, and a BER bucket for example. If the BER is bad (e.g., below a predetermined level), the link may be brought down to analyze. In the analysis, pre-FEC/post FEC data may be collected along with SNR, pulse response, SAR value and other metrics. If the BER is good (e.g., above a predetermined level), time stamp data may be collected that may serve as an initial ML dataset.

Once sufficient data has been collected over time on channels on a particular system or particular type of channel, embodiments of the disclosure may begin to build an initial data set for the ML algorithm. In other words, initial data and data preparation may be conducted, an ML model may be trained, the model may be evaluated (and retrained), and then the model may be deployed and results may be gathered. Over time with timestamp data, the following may be performed: i) outliers in link quality may be found; ii) unexpected receiver behavior may be discovered; iii) subtle changes in metrics/parameters use to build the buckets may be tracked; and iv) the links may be challenged with alternate metrics to rebuilt the ML model from the initial data set. Accordingly, uses of the ML model may include, but not limited to: i) tracking equalization applied with a BER target for a particular loss bucket; ii) training data of equalization and BER metrics to loss metrics; iii) new links on new systems may use this trained ML data to predict BER or equalization metrics from the expected loss data; and iv) the ML model may be used to check link quality as per an expectation and improve the ML model. The data may be collected over the cloud (e.g., for users allowing data collection over the cloud). In addition, data may be collected via standard console port based system log messages and ported over to a local server for example.

Consistent with embodiments of the disclosure, a preventative maintenance window and a full maintenance window may be used. The preventative maintenance window may enable the collection of data via system logs or cloud on various links. With the preventative maintenance window, for predetermined links, the links may be dropped, a metric test may be ran, and the links reenabled. Then the ML model may be used to make a comparison between predicted and actual variation of metrics to create quality metric. From this a prediction may be made based on the ML model as to which links over time could pose potential issues. If any metric is out of range, the full maintenance window may be ran. With the full maintenance window, identified links may be dropped, the SerDes may be retuned, the metric test may be ran again, and then the link may be reenabled.

Green Mode Optimization Process to Minimize Energy Cost

There may be a plurality of lanes (i.e., links) on a system, some of them to the backplane, some to the front end, and some chip to chip. Embodiments of the disclosure may comprise a process for optimizing SerDes power versus performance to enable the buyback of some thermal footprint (i.e., power benefits) for performance. In other words, embodiments of the disclosure may buyback power margins by optimizing lane performance in response to analyzing links and not running the SerDes in full power mode if full power is not needed. This process may be performed by computing device 400 as described in greater detail below.

SerDes power may be a contribution of various individual blocks, for example, PLL, Digital blocks, ADCs, Feedforward Equalizers (FFEs), Decision Feedback Equalizers (DFEs). The power of some blocks may scale with bit rate and some may not, so power may be bit rate dependent. For example, moving from a 16 tap FFE to an 8 tap FFE may reduce power of the FFE block by 65%. Moving an ADC for 7 bit to 3 bit may reduce power 10% on the analog side and some power savings may be realized on the digital side. Reduction in Finite Impulse Response (FIR) taps in a transmitter may add further savings. This may not reduce SerDes performance, but rather optimizing it based on accurate system channel information with correct metric tradeoffs. In addition to a power cost benefit, reducing power may provide a thermal benefit from a system cooling perspective.

With this process, a lane (i.e., link) quality check using the predictive channel fault analysis may be performed as described above. If the lane is healthy, a link loss analysis may be performed to optimize power, optimize packet drop, or optimize bit rate power scaling for example. With power optimization, a target BER may be set and each SerDes block may be optimized to track BER reduction with the target BER as the goal. In other words, power versus target BER may be tracked to optimize lane SerDes power. With packet drop optimization, an acceptable packet drop target percentage may be set along with a new BER target. Then the power optimization may be ran again. With bit rate power scaling optimization, lanes that may reduce link rate may be chosen and the BER target may be set. The BER target may be set in accordance with a user defined value depending on the user tolerance or requirements. Then the power optimization may be ran again.

Figure 4:
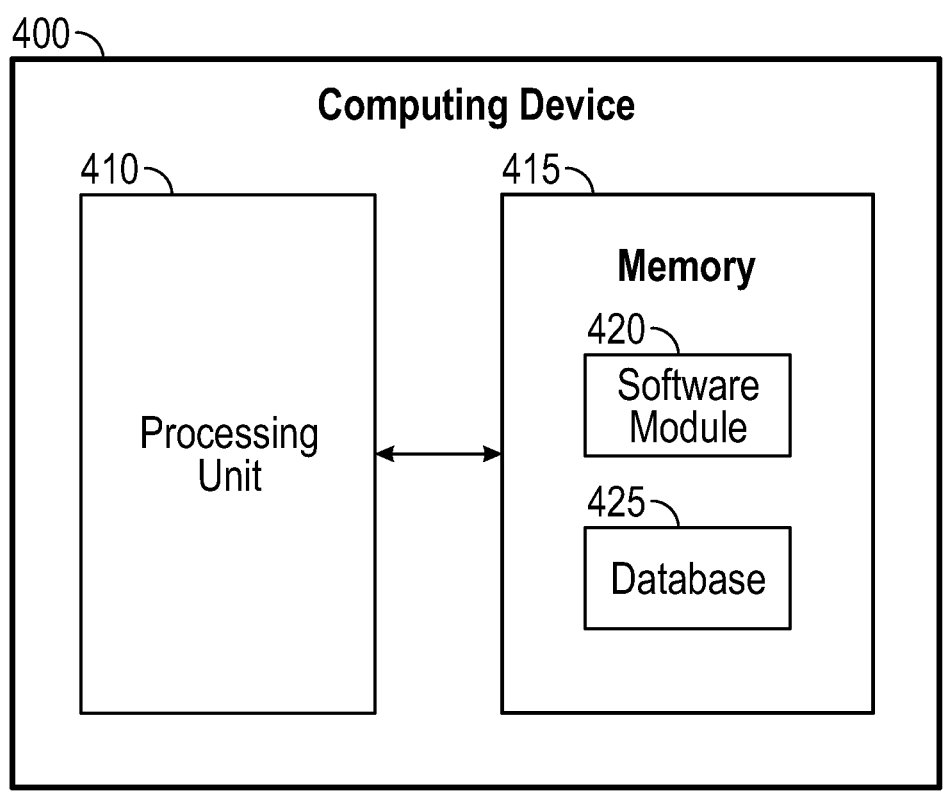
FIG. 4 is a block diagram of a computing device.

FIG. 4 shows computing device 400. As shown in FIG. 4, computing device 400 may include a processing unit 410 and a memory unit 415. Memory unit 415 may include a software module 420 and a database 425. While executing on processing unit 410, software module 420 may perform, for example, processes described above including providing connectivity failure detection as described with respect to FIG. 2. Computing device 400, for example, may provide an operating environment for transmitter 105 or receiver 110. Transmitter 105 or receiver 110 may operate in other environments and are not limited to computing device 400.

Computing device 400 may be implemented using a Wi-Fi access point, a tablet device, a mobile device, a smart phone, a telephone, a remote control device, a set-top box, a digital video recorder, a cable modem, a personal computer, a network computer, a mainframe, a router, a switch, a server cluster, a smart TV-like device, a network storage device, a network relay devices, or other similar microcomputer-based device. Computing device 400 may comprise any computer operating environment, such as hand-held devices, multiprocessor systems, microprocessor-based or programmable sender electronic devices, minicomputers, mainframe computers, and the like. Computing device 400 may also be practiced in distributed computing environments where tasks are performed by remote processing devices. The aforementioned systems and devices are examples and computing device 400 may comprise other systems or devices.

An embodiment consistent with the disclosure may comprise a method for providing connectivity failure detection. The method may comprise: determining, by a receiver, a forward time value comprising a time a forward signal takes to travel from a transmitter over a channel to the receiver; determining, by the receiver, a reflected time value comprising a time a reflected signal takes to travel to the receiver, wherein the reflected signal is associated with the forward signal; and determining that a discontinuity exists on the channel based on the forward time value and the reflected time value, wherein the reflected signal is caused by the discontinuity and a high impedance or low impedance at the transmitter present after the forward signal is sent. Determining that the discontinuity exists may further comprise determining that the reflected signal has a magnitude greater than a predetermined value. The method may further comprise determining a location of the discontinuity based on the forward time value and the reflected time value. Determining the location of the discontinuity may comprise determining a distance in the channel from the receiver to the discontinuity. The reflected signal may be a reflected version of the forward signal that reflects off of the discontinuity, travels back to the transmitter, reflects off the transmitter due to the high impedance or low impedance, and travels to the receiver through the discontinuity. The high impedance or low impedance at the transmitter may be caused by turning off the transmitter once the forward signal has been sent. The method may further comprise using the determined discontinuity to predict link performance on another system or using the determined discontinuity to determine if a lower power level can be maintained on the channel.

Another embodiment consistent with the disclosure may comprise a system for providing connectivity failure detection. The system may comprise a memory storage and a processing unit disposed in a receiver and coupled to the memory storage. The processing unit may be operative to: determine a forward time value comprising a time a forward signal takes to travel from a transmitter over a channel to the receiver; determine a reflected time value comprising a time a reflected signal takes to travel to the receiver, wherein the reflected signal is associated with the forward signal; and determine that a discontinuity exists on the channel based on the forward time value and the reflected time value, wherein the reflected signal is caused by the discontinuity and a high impedance or low impedance at the transmitter present after the forward signal is sent. The processing unit being operative to determine that the discontinuity exists further comprises the processing unit being operative to determine that the reflected signal has a magnitude greater than a predetermined value. The processing unit may be further operative to determine a location of the discontinuity based on the forward time value and the reflected time value. The processing unit being operative to determine the location of the discontinuity comprises the processing unit being operative to determine a distance in the channel from the receiver to the discontinuity. The reflected signal may be a reflected version of the forward signal that reflects off of the discontinuity, travels back to the transmitter, reflects off the transmitter due to the high impedance or low impedance, and travels to the receiver through the discontinuity. The high impedance or low impedance at the transmitter may be caused by turning off the transmitter once the forward signal has been sent.

Yet another embodiment consistent with the disclosure may comprise a computer-readable medium that stores a set of instructions which when executed perform a method executed by the set of instructions. The set of instruction may comprise: determining, by a receiver, a forward time value comprising a time a forward signal takes to travel from a transmitter over a channel to the receiver; determining, by the receiver, a reflected time value comprising a time a reflected signal takes to travel to the receiver, wherein the reflected signal is associated with the forward signal; and determining that a discontinuity exists on the channel based on the forward time value and the reflected time value, wherein the reflected signal is caused by the discontinuity and a high impedance or low impedance at the transmitter present after the forward signal is sent. The set of instructions may further comprise determining a location of the discontinuity based on the forward time value and the reflected time value, wherein determining the location of the discontinuity comprises determining a distance in the channel from the receiver to the discontinuity. The reflected signal may comprise a reflected version of the forward signal that reflects off of the discontinuity, travels back to the transmitter, reflects off the transmitter due to the high impedance or low impedance, and travels to the receiver through the discontinuity. The high impedance or low impedance at the transmitter may be caused by turning off the transmitter once the forward signal has been sent. The set of instructions may further comprise using the determined discontinuity to predict link performance on another system or using the determined discontinuity to determine if a lower power level can be maintained on the channel.

Embodiments of the disclosure, for example, may be implemented as a computer process (method), a computing system, or as an article of manufacture, such as a computer program product or computer readable media. The computer program product may be a computer storage media readable by a computer system and encoding a computer program of instructions for executing a computer process. The computer program product may also be a propagated signal on a carrier readable by a computing system and encoding a computer program of instructions for executing a computer process. Accordingly, the present disclosure may be embodied in hardware and/or in software (including firmware, resident software, micro-code, etc.). In other words, embodiments of the present disclosure may take the form of a computer program product on a computer-usable or computer-readable storage medium having computer-usable or computer-readable program code embodied in the medium for use by or in connection with an instruction execution system. A computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific computer-readable medium examples (a non-exhaustive list), the computer-readable medium may include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

While certain embodiments of the disclosure have been described, other embodiments may exist. Furthermore, although embodiments of the present disclosure have been described as being associated with data stored in memory and other storage mediums, data can also be stored on or read from other types of computer-readable media, such as secondary storage devices, like hard disks, floppy disks, or a CD-ROM, a carrier wave from the Internet, or other forms of RAM or ROM. Further, the disclosed methods' stages may be modified in any manner, including by reordering stages and/or inserting or deleting stages, without departing from the disclosure.

Furthermore, embodiments of the disclosure may be practiced in an electrical circuit comprising discrete electronic elements, packaged or integrated electronic chips containing logic gates, a circuit utilizing a microprocessor, or on a single chip containing electronic elements or microprocessors. Embodiments of the disclosure may also be practiced using other technologies capable of performing logical operations such as, for example, AND, OR, and NOT, including but not limited to, mechanical, optical, fluidic, and quantum technologies. In addition, embodiments of the disclosure may be practiced within a general purpose computer or in any other circuits or systems.

Embodiments of the disclosure may be practiced via a system-on-a-chip (SOC) where each or many of the element illustrated in FIG. 1 may be integrated onto a single integrated circuit. Such an SOC device may include one or more processing units, graphics units, communications units, system virtualization units and various application functionality all of which may be integrated (or "burned") onto the chip substrate as a single integrated circuit. When operating via an SOC, the functionality described herein with respect to embodiments of the disclosure, may be performed via application-specific logic integrated with other components of computing device 400 on the single integrated circuit (chip).

Embodiments of the present disclosure, for example, are described above with reference to block diagrams and/or operational illustrations of methods, systems, and computer program products according to embodiments of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While the specification includes examples, the disclosure's scope is indicated by the following claims. Furthermore, while the specification has been described in language specific to structural features and/or methodological acts, the claims are not limited to the features or acts described above. Rather, the specific features and acts described above are disclosed as example for embodiments of the disclosure.

What is claimed is:

1. A method comprising:
   determining, by a receiver, a forward time value comprising a time a forward signal takes to travel from a transmitter over a channel to the receiver;
   determining, by the receiver, a reflected time value comprising a time a reflected signal takes to travel to the receiver, wherein the reflected signal is associated with the forward signal; and
   determining that a discontinuity exists on the channel based on the forward time value and the reflected time value, wherein the reflected signal is caused by the discontinuity and a high impedance or low impedance at the transmitter present after the forward signal is sent wherein the high impedance or low impedance at the transmitter is caused by turning off the transmitter once the forward signal has been sent.

2. The method of claim 1, wherein determining that the discontinuity exists further comprises determining that the reflected signal has a magnitude greater than a predetermined value.

3. The method of claim 1, further comprising determining a location of the discontinuity based on the forward time value and the reflected time value.

4. The method of claim 3, wherein determining the location of the discontinuity comprises determining a distance in the channel from the receiver to the discontinuity.

5. The method of claim 1, wherein the reflected signal is a reflected version of the forward signal that reflects off of the discontinuity, travels back to the transmitter, reflects off the transmitter due to the high impedance or low impedance, and travels to the receiver through the discontinuity.

6. The method of claim 1, further comprising using the determined discontinuity to predict link performance on another system.

7. The method of claim 1, further comprising using the determined discontinuity to determine if a lower power level can be maintained on the channel.

8. A system comprising:
a memory storage; and
a processing unit disposed in a receiver, the processing unit coupled to the memory storage, wherein the processing unit is operative to:
determine a forward time value comprising a time a forward signal takes to travel from a transmitter over a channel to the receiver;
determine a reflected time value comprising a time a reflected signal takes to travel to the receiver, wherein the reflected signal is associated with the forward signal; and
determine that a discontinuity exists on the channel based on the forward time value and the reflected time value, wherein the reflected signal is caused by the discontinuity and a high impedance or low impedance at the transmitter present after the forward signal is sent wherein the high impedance or low impedance at the transmitter is caused by turning off the transmitter once the forward signal has been sent.

9. The system of claim 8, wherein the processing unit being operative to determine that the discontinuity exists further comprises the processing unit being operative to determine that the reflected signal has a magnitude greater than a predetermined value.

10. The system of claim 8, further comprising the processing unit being operative to determine a location of the discontinuity based on the forward time value and the reflected time value.

11. The system of claim 10, wherein the processing unit being operative to determine the location of the discontinuity comprises the processing unit being operative to determine a distance in the channel from the receiver to the discontinuity.

12. The system of claim 8, wherein the reflected signal is a reflected version of the forward signal that reflects off of the discontinuity, travels back to the transmitter, reflects off the transmitter due to the high impedance or low impedance, and travels to the receiver through the discontinuity.

13. A non-transitory computer-readable medium that stores a set of instructions which when executed perform a method executed by the set of instructions comprising:
determining, by a receiver, a forward time value comprising a time a forward signal takes to travel from a transmitter over a channel to the receiver;
determining, by the receiver, a reflected time value comprising a time a reflected signal takes to travel to the receiver, wherein the reflected signal is associated with the forward signal; and
determining that a discontinuity exists on the channel based on the forward time value and the reflected time value, wherein the reflected signal is caused by the discontinuity and a high impedance or low impedance at the transmitter present after the forward signal is sent wherein the high impedance or low impedance at the transmitter is caused by turning off the transmitter once the forward signal has been sent.

14. The non-transitory computer-readable medium of claim 13, further comprising determining a location of the discontinuity based on the forward time value and the reflected time value, wherein determining the location of the discontinuity comprises determining a distance in the channel from the receiver to the discontinuity.

15. The non-transitory computer-readable medium of claim 13, wherein the reflected signal is a reflected version of the forward signal that reflects off of the discontinuity, travels back to the transmitter, reflects off the transmitter due to the high impedance or low impedance, and travels to the receiver through the discontinuity.

16. The non-transitory computer-readable medium of claim 13, further comprising using the determined discontinuity to predict link performance on another system.

17. The non-transitory computer-readable medium of claim 13, further comprising using the determined discontinuity to determine if a lower power level can be maintained on the channel.

* * * * *